(12) United States Patent
Uhlig et al.

(10) Patent No.: US 7,553,207 B2
(45) Date of Patent: Jun. 30, 2009

(54) ORGANIC LIGHT-EMITTING DIODE AND METHOD OF MANUFACTURING THE SAME

(75) Inventors: Albrecht Uhlig, Berlin (DE); Kerstin Nolte, Berlin (DE); Thomas Schrader, Berlin (DE)

(73) Assignee: Samsung Mobile Display Co., Ltd., Suwon (KR)

( * ) Notice: Subject to any disclaimer, the term of this patent is extended or adjusted under 35 U.S.C. 154(b) by 388 days.

(21) Appl. No.: 11/155,562

(22) Filed: Jun. 20, 2005

(65) Prior Publication Data

US 2005/0280361 A1    Dec. 22, 2005

(30) Foreign Application Priority Data

Jun. 22, 2004   (DE)   ................... 10 2004 031 071
Dec. 30, 2004   (KR)   ................... 10-2004-0116338

(51) Int. Cl.
   *H01L 29/04*   (2006.01)
   *H01L 31/20*   (2006.01)
   *H01L 31/0376* (2006.01)
   *H01L 27/01*   (2006.01)

(52) U.S. Cl. .................. 445/24; 445/25; 313/504; 313/507; 257/72

(58) Field of Classification Search ............... 313/504, 313/507, 508, 506; 445/25; 438/26; 257/75
   See application file for complete search history.

(56) References Cited

U.S. PATENT DOCUMENTS

| | | | | |
|---|---|---|---|---|
| 6,037,190 A * | 3/2000 | Chao et al. | ............. | 438/35 |
| 6,160,273 A * | 12/2000 | Fork et al. | ............. | 257/98 |
| 6,210,814 B1 * | 4/2001 | Thompson et al. | ........ | 428/690 |
| 6,245,393 B1 * | 6/2001 | Thompson et al. | ........ | 427/511 |
| 6,331,356 B1 * | 12/2001 | Angelopoulos et al. | .. | 428/411.1 |
| 6,358,664 B1 * | 3/2002 | Nirmal et al. | ............. | 430/200 |
| 6,459,199 B1 * | 10/2002 | Kido et al. | ............. | 313/504 |
| 6,482,564 B2 * | 11/2002 | Nirmal et al. | ............. | 430/200 |
| 6,602,790 B2 * | 8/2003 | Kian et al. | ............. | 438/690 |

(Continued)

FOREIGN PATENT DOCUMENTS

EP    1351323    10/2003

(Continued)

OTHER PUBLICATIONS

E. Taylor, "Inorganic and Polymer Photonic Sensor Technologies in Space Mission", IEEE Instrumentation and measurement Technology Conference, Budapest, May 21-23, 2001, pp. 2006-2013.

(Continued)

*Primary Examiner*—Sikha Roy
*Assistant Examiner*—Tracie Y Green
(74) *Attorney, Agent, or Firm*—H.C. Park & Associates, PLC

(57) ABSTRACT

An organic light-emitting diode (OLED) with an increased service life and a method of manufacturing the same are provided. The OLED is subjected to electromagnetic radiation with a spectrum that at least partially overlaps the absorption spectrum of an organic material layer of the OLED. As a result, the OLED has a longer service life, reduced decay in its initial brightness, and more saturated color than a conventional OLED.

17 Claims, 2 Drawing Sheets

U.S. PATENT DOCUMENTS

| | | | |
|---|---|---|---|
| 6,667,143 B2* | 12/2003 | Nirmal et al. | 430/200 |
| 2001/0017155 A1* | 8/2001 | Bellmann et al. | 136/263 |
| 2003/0148594 A1* | 8/2003 | Yamazaki et al. | 438/487 |
| 2003/0168975 A1* | 9/2003 | Lovell et al. | 313/509 |
| 2003/0170944 A1* | 9/2003 | Kimura | 438/200 |
| 2003/0186078 A1* | 10/2003 | Murata et al. | 428/690 |
| 2003/0194484 A1* | 10/2003 | Yamazaki et al. | 427/66 |
| 2003/0201716 A1* | 10/2003 | Yamazaki et al. | 313/506 |
| 2003/0209972 A1* | 11/2003 | Holmes et al. | 313/504 |
| 2003/0222577 A1 | 12/2003 | Lu | 313/504 |
| 2004/0031917 A1 | 2/2004 | Hager | 250/282 |
| 2004/0079923 A1* | 4/2004 | Yamazaki et al. | 252/301.16 |

FOREIGN PATENT DOCUMENTS

| | | |
|---|---|---|
| JP | 04079193 | 3/1992 |
| JP | 09330790 | 12/1997 |
| JP | 2001176661 | 6/2001 |
| JP | 2001-326076 | 11/2001 |
| JP | 2002124379 | 4/2002 |
| JP | 2002203672 | 7/2002 |
| WO | 0193332 | 12/2001 |
| WO | 03/088371 | 10/2003 |
| WO | WO 03/083960 | 10/2003 |

OTHER PUBLICATIONS

M. Ishii, "Luminance Decay Mechanism in Organic Light-Emitting Diodes", Research Report, R&D Review of Toyota CRDL, vol. 38, No. 2, pp. 55-60.

* cited by examiner

ORGANIC LIGHT-EMITTING DIODE AND METHOD OF MANUFACTURING THE SAME

CROSS REFERENCE TO RELATED APPLICATIONS

This application claims the benefits of Korean Patent Application No. 10-2004-116338, filed on Dec. 30, 2004, in the Korean Intellectual Property Office, and German Patent Application No. 10 2004 031 071.8, filed on Jun. 22, 2004 in the German Intellectual Property Office, the disclosures of which are incorporated herein for all purposes as if fully set forth herein.

BACKGROUND OF THE INVENTION

1. Field of the Invention

The present invention relates to an OLED and a method of manufacturing the same, and more particularly, to an OLED with a long service life and a method of manufacturing the same.

2. Description of the Related Art

The commercial use of organic light-emitting diodes (OLEDs) in display devices has been increasing. Display devices, such as plain displays, monochrome displays, seven-segment displays, full-color active matrix (AM) displays, and the like, have various types of OLEDs with various properties. As the complexity of display devices increases, requirements of the OLED therein, such as service life duration also increase.

Display devices incorporating OLEDs have been produced since the 1980's. OLEDs can be divided into polymer OLEDs (pLEDs) and small molecule OLEDs (SM-OLEDs). When a display device including OLEDs operates for the first time, the brightness of the OLEDs decays quickly. Such an undesired decay results in a reduced service life. Therefore, in order to stabilize display devices, a burn-in process in which a display device is operated continually for about 24 hours at a predetermined brightness is performed before measurement of the service life. The cause of the initial quick brightness decay in OLEDs is not known.

US 2004/0031917A1 and WO 2003/088371 (UDC) disclose a UV-hardening adhesive developed using UV light. The UV-hardening adhesive is used as an encapsulant. EP 1 351 323 (Kodak) discloses a UV hardening adhesive used to fix a drying agent. WO 2003/083960 (CDT) discloses the use of a photo-resist based on a polyimide material for structuring surfaces of a substrate for inkjet printing. The photo-resist can be structured using UV light. In WO 01/93332 (microemission display), a photo resist that can be structured using UV light is used to separate adjacent pixels and form an active ITO surface. US 2003/0222577 (Ritdisplay Corporation) discloses an OLED display device manufactured using a color down conversion process. In this case, a UV-emitter is used as an OLED material.

No method of preventing an initial quick decrease in the service life of an OLED is has been disclosed. Additionally, in order to perform the burn-in process in which a display device continually operates for a predetermined amount of time (about 24 hours) at a predetermined brightness, each OLED must be continually supplied with power for a long period of time. Therefore, the manufacturing costs for OLEDs increase.

SUMMARY OF THE INVENTION

The present invention provides an OLED with an increased service life and a method of manufacturing and/or treating the same. The OLED manufactured according to the present invention has a longer service life, a smaller initial brightness decay, and a shift to more saturated color coordinates compared to a conventional OLED.

Additional features of the invention will be set forth in the description which follows, and in part will be apparent from the description, or may be learned by practice of the invention.

The present invention discloses a method of manufacturing an organic light-emitting diode (OLED) having an organic material having an absorption spectrum, where the organic material can generate photo-luminescence by absorbing radiated electromagnetic energy of a wavelength of the absorption spectrum to increase a service life of the OLED, including irradiating the OLED with electromagnetic radiation from a light source having an electromagnetic spectrum wherein the electromagnetic spectrum at least partially corresponds to the absorption spectrum of the organic material.

The present invention also discloses an OLED, comprising a first electrode, an organic material layer having an absorption spectrum. The OLED also includes a second electrode, wherein the OLED is subjected to electromagnetic radiation having a spectrum that at least partially overlaps the absorption spectrum of the organic material layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention.

DETAILED DESCRIPTION OF THE INVENTION

Figure 1:
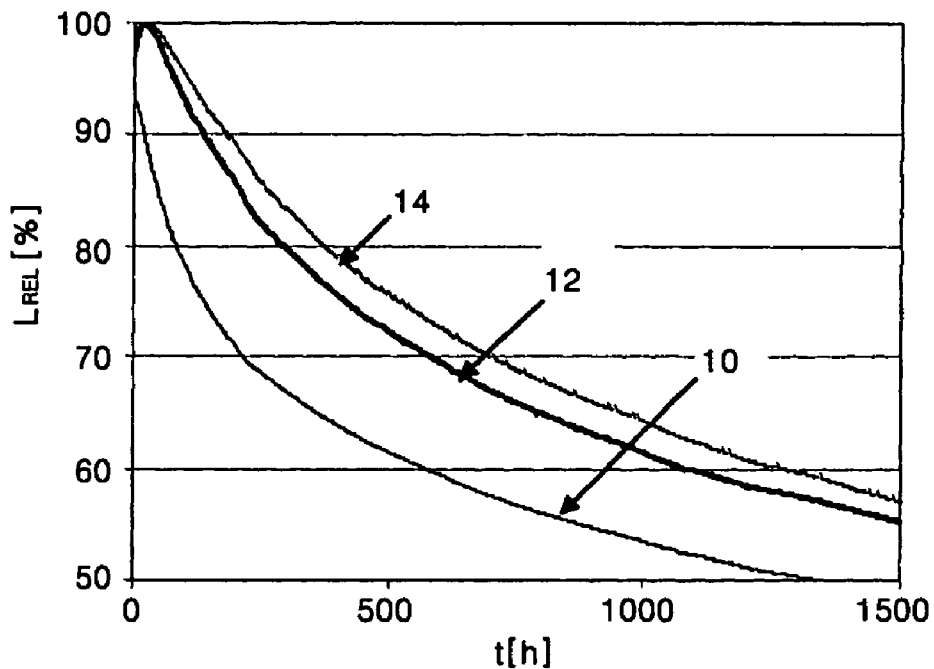
FIG. 1 illustrates service life curves of OLED devices some of which have been subjected to UV/Visible light irradiation.

An organic light-emitting diode (OLED) according to an embodiment of the present invention may have a substantially longer service life than an OLED display device manufactured/treated using conventional techniques. In order to increase the service life, the OLED is subjected to electromagnetic radiation having a spectrum that corresponds at least partially to the absorption spectrum of an organic material layer of the OLED. Light, such as, for example, intensive UV/Visible light is irradiated onto the OLED, resulting in an increase in the service life, a decrease in an initial decay of the brightness, and a shift to more saturated colors of the treated OLED device.

A storage period between when an OLED display device is manufactured and when the OLED is first operated considerably affects the service life of the OLED display device. To a certain extent, the service life of the OLED display device can be increased by long storage before use. Accordingly, the OLED may be stored in a box made of a material which transmits visible light but not UV light. By doing this in the laboratory, the service life may be increased by about 50%.

The storage period decreases the initial decline of the service life curve of the OLED device.

In almost all OLED display devices, the initial decline is 20% to 30% of the initial brightness. In addition, since the initial decline is dependent on materials used to produce individual colors of the OLEDs, the initial decline negatively effects the white color of a display device and causes color shifting of the display. However, as a result of the storage period, color shifting of the OLED occurs toward more saturated color coordinates for each individual color, which is observed for about 30 days after the storage. Therefore, the storage period has a considerably positive effect in the quality of the OLED display device. However, it is not possible to store the OLED display device for such long periods of time after they are manufactured.

The present invention obtains a target-specific acceleration of this pre-ageing process that results from the storage. The irradiation of electromagnetic waves onto the OLED contributes to a substantial increase in the service life of the OLED. The irradiation of electromagnetic waves is performed before the OLED is first used, particularly after an OLED cathode is deposited. However, when the cathode is deposited in a box filled with inert gas or in a vacuum evaporation chamber, the irradiation can be performed before the cathode is deposited. Alternatively, the irradiation can be performed after the OLED first operates, preferably, during the burn-in process. During irradiation, the electromagnetic waves may be injected through a side surface of the OLED which has a transparent electrode for about 1 minute to about 10 hours, and preferably, about 3 hours to about 6 hours. An anode can be used as the transparent electrode.

The light source may be a sun simulator or UV diodes with corresponding intensity. The light source should be configured so that light from the light source may generate photoluminescence in the OLED display device. That is, the excitation spectrum of the light source and the absorption spectrum of an emission material of the OLED display device should at least partially overlap, and preferably, overlap entirely.

The effect of the irradiation can be verified by using the treated display device through measurable criteria. The effects of the irradiation include:

1. Increased saturation of color coordinates due to shifting of the long wavelength edge of the OLED emission spectrum by less than about 20 nm; and 2. Reducing or preventing an initial quick decrease of the service life.

According to an embodiment of the present invention, an OLED including a first electrode, an organic material layer, and a second electrode is produced by being subjected to electromaganetic radiation of a certain range of wavelengths. The spectrum of the electromagnetic radiation at least partially corresponds to the absorption spectrum of the organic material layer of the OLED. The irradiation can be performed before the OLED is first operated.

Hereinafter, the present invention will be described in detail by explaining exemplary embodiments of the invention with reference to the attached drawings, in which the embodiments are at least partially illustrated.

FIG. 1 is a graph showing an increase in the service life of an OLED on which light is irradiated according to an embodiment of the present invention relative to a conventional OLED. In the graph, the y-axis is brightness ("L") and the x-axis is the time in hours. In this case, Lrel=L(t)/Lmax. Curves 12 and 14 of FIG. 1 are obtained when a pLED is subjected to UV/Visible radiation. Curve 10 of FIG. 1 is obtained when an otherwise comparable pLED was not subjected to UV/Visible radiation.

As shown by FIG. 1, the pLEDs subjected to UV/Visible radiation experience a substantial increase in their service life. The brightnesses of pLEDs exposed to UV light for 3 hours (curve 12) and 6 hours (curve 14) were 70% of the initial brightness after the pLEDs operated for more than about 500 hours. The conventional OLED that was not exposed to UV light had about 70% brightness after operating for about 200 to 300 hours (curve 10).

According to an embodiment of the present invention, a boron silicate glass coated with 100 nm indium tin oxide (ITO) is used as a substrate of the OLED. Specifically, ITO is arranged on a middle portion of the boron silicate glass to a thickness of about 2 mm in a stripe. The coated substrate is cleaned using isopropanol in an ultrasonic bath for about 5 minutes, dried in flowing nitrogen gas, and then exposed to UV/ozone for 10 minutes.

Next, a hole transport material, such as, for example, LVW 142 (Baytron P® obtained from Bayer AG) is deposited on the resulting substrate by spin-coating to form a hole transport layer with a thickness of about 50 nm, and then dried in a nitrogen atmosphere at about 180 degrees C. for about 10 minutes.

Then, light-emitting material, such as, for example, Polymer Green 1300 (DOW LUMINATION® obtained from DOW Chemical) made from a 1 wt % solution of water-free xylene is deposited by spin coating in a nitrogen atmosphere to form a thick film with a thickness of about 70 nm, and then dried on a heating plate at about 190 degrees C. in a nitrogen atmosphere for about 10 minutes.

The resulting substrate is transferred to a vacuum chamber in a nitrogen atmosphere. In order to form a cathode by thermal evaporation, lithium fluoride, calcium, aluminum are sequentially vacuum-deposited to thicknesses of about 1 nm, 10 nm, and 500 nm, respectively. The cathode overlaps the 2 mm thick ITO layer and has a surface configured to receive external electrical contacts.

The resulting substrate is transferred under a protecting gas, and then encapsulated by an encapsulation glass and a thermally hardened epoxy adhesive to reduce or prevent exposure to oxygen and water to the OLED from the surrounding area. Additionally, in order to minimize the exposure to oxygen and water, a barrier, such as, for example, GDO/CA1/R/T-F (obtained from SAES Getter S.A.) may be adhesively applied to the encapsulation glass.

After the epoxy adhesive is thermally hardened, the OLED display device is positioned under a light source, such as, for example, a Solarconstant 1200 obtained from KSH Lichttechnik GmhH Deutschland. The OLED is spaced from the light source by about 5-150 cm, and preferably about 30 cm, with the transparent ITO electrode facing the light source. The spectrum of the light source is preferable similar to the spectrum of the sun. The light source preferably radiates about 100 W/cm$^2$ of light onto the OLED for about 3 hours. Additionally, the energy density of the electromagnetic radiation may be equal to or greater than about 500 Ws/cm$^2$.

The irradiation improves the service life of a polymer OLED display device. In addition, the service life of a low molecular weight OLED can be increased by the irradiation. It has been confirmed that the service life of an OLED increases by about 50% when exposed to UV/Visible light compared to an OLED without exposure to UV/Visible light.

According to one embodiment of the present invention, the initial quick decay of the OLED display device performance (See, curve 10 in FIG. 1) can be avoided almost entirely by the irradiation process. For example, shifting of the white point and the substantial decline of brightness during the first hours of operation can be reduced or avoided. As a result, a conventional burn-in process for the display device is not needed, and the manufacturing process can be completed in a reduced time at a lower cost. Further, the service life of the OLED display device may be increased considerably compared to a conventional OLED.

Figure 2:
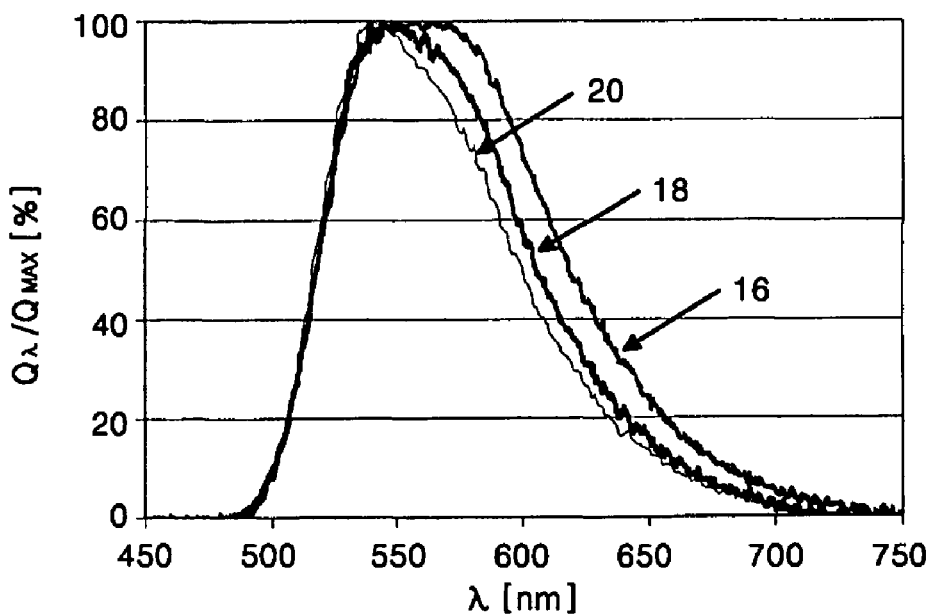
FIG. 2 illustrates electroluminescent spectra of OLED devices some of which have been subjected to UV/Visible light irradiation.

Referring to FIG. 2, the longer wavelength region of the emission spectrum of the OLED is shifted by less than about 20 nm due to the irradiation process. Accordingly, the color characteristics of the OLED display device can be improved, such as an increase in color saturation with reference to the Commission Internationale d'Eclairage color coordinates. In this case, the long wavelength region of the emission spectra (curves 18 and 20) of OLEDs exposed to UV/Visible shifts towards the shorter-wave lengths as compared to the emission spectrum (16) of the OLED that is not exposed to UV/Visible light. The shifting of color coordinates leads to more saturated color.

Figure 3:
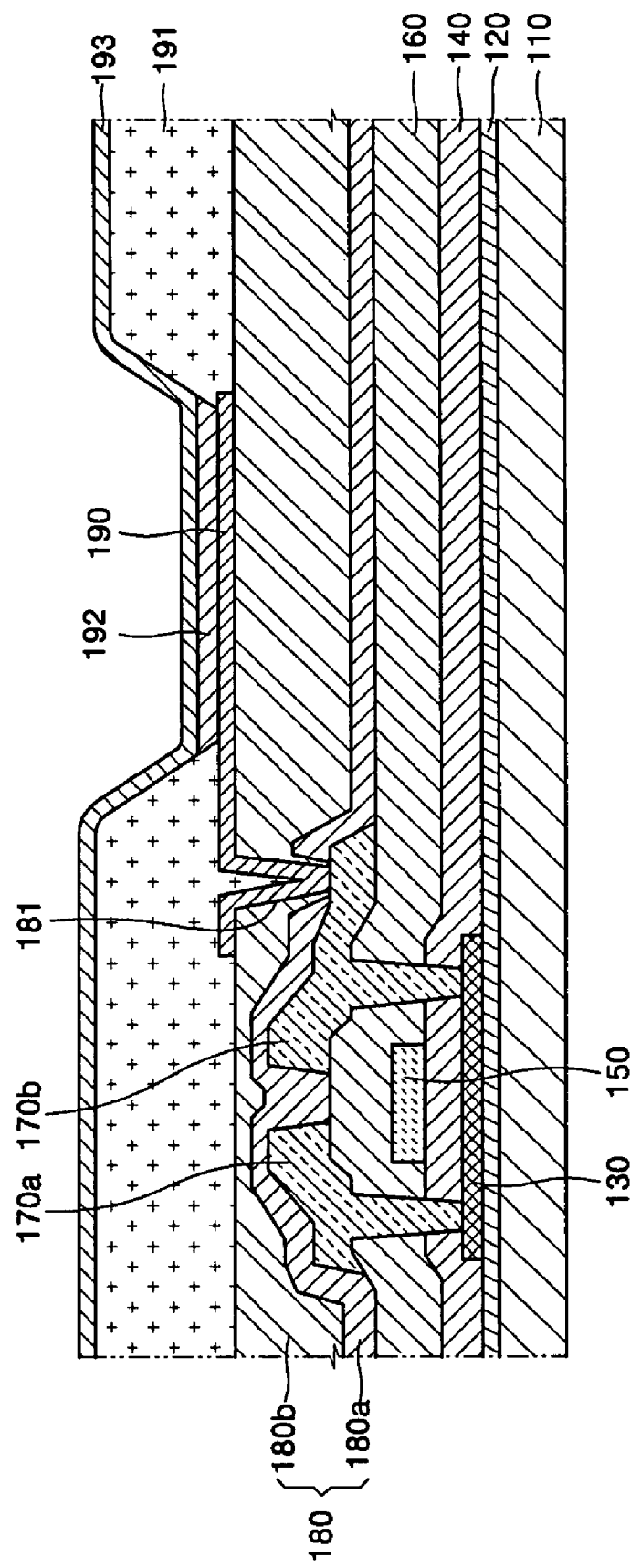
FIG. 3 is a sectional view of an AM-type OLED device according to an embodiment of the present invention.

FIG. 3 is a sectional view of an AM-type OLED according to an embodiment of the present invention. As shown in FIG. 3, an AM-type OLED includes buffer layer 120 formed on a surface of a substrate 110. It should be noted that in some embodiments, a substrate of the OLED has a transmissivity greater than about 0.5 in higher-frequency and lower-frequency portions of the light source electromagnetic spectrum used to irradiate the OLED. Additionally, the electromagnetic spectrum at least partially corresponds to the absorption spectrum of the organic material layer of the OLED. A semiconductor active layer 130 is formed on the buffer layer 120. The semiconductor active layer 130 may include an amorphous silicon layer or a polycrystalline silicon layer. The semiconductor active layer 130 may include source and drain regions doped with an N+ type dopant and a P+ type dopant, respectively, and a channel region therebetween. Alternatively, the semiconductor active layer 130 may be made of an organic semiconductor.

A gate electrode 150 is disposed on the semiconductor active layer 130. The electrode material for forming the gate electrode 150 is selected for certain properties, such as, good adhesiveness to adjacent layers, surface smoothness of the underlying layer, ease of manufacturing, and the like. For example, the electrode material may be MoW, Al/Cu, or the like, but is not limited thereto.

The gate electrode 150 is insulated from the semiconductor active layer 130 by a gate insulating layer 140 formed therebetween. An interlayer 160 acting as an insulator is formed on the gate electrode 150 and the gate insulating layer 140. The interlayer 160 may be a single layer or may include a plurality of layers. Source and drain electrodes 170a and 170b are formed on the interlayer 160 and may be coupled to source and drain regions, respectively, of the semiconductor active layer 130 through contact holes formed in the interlayer 160 and the gate insulating layer 140. The source and drain electrodes 170a and 170b may comprise Mo and Al and other suitable materials. For example, the source and drain electrodes 170a and 170b can be composed of MoW. Further, each of the source and drain electrodes 170a and 170b may include a plurality layers, such as Mo/Al. The source and drain electrodes 170a and 170b may be thermally treated to form an ohmic contact with certain regions of the semiconductor active layer 130.

At least one insulating layer 180 is formed on the source and drain electrodes 170a and 170b. The insulating layer 180 may include multiple layers, including either a passivation layer 180a, or a planarization layer 180b used to planarize an underlying thin film transistor, or both. The passivation layer 180a may include an inorganic material, such as SiNx, SiO$_2$, or the like. The planarization layer 180b may be made of an organic material, such as benzocyclobutene (BCB), acryl, or the like. The insulating layer 180 may be a single layer, or include a plurality of layers. The insulating layer 180 may have a via hole 181 therethrough.

A first electrode 190 acting as a pixel electrode is formed on a surface of the planarizing layer 180b. The first electrode 190 may be composed of a conductive oxide, such as ITO or the like. After the first electrode 190 is formed, a pixel defining layer 191 is formed. The pixel defining layer 191 is formed over the planarization layer 180b and has an opening which exposes a portion of the first electrode 190. Then, an organic material layer is deposited to form an organic light-emitting unit 192 which includes an emission layer which is formed on a portion of the first electrode layer 190 defined by the pixel defining layer 191.

The organic light-emitting unit 192 may include a hole injection layer, a hole transport layer, an emission layer, an electron transport layer, or an electron injection layer, etc. but the organic light-emitting unit 192 is not necessarily limited to the aforementioned layers if the spectrum of the electromagnetic radiation irradiated onto the OLED at least partially overlaps the absorption spectrum of the organic material of the organic light-emitting unit 192.

A second electrode 193 including at least one layer may be formed on the organic light-emitting unit 192. Either the first electrode layer 190 or the second electrode layer 193, or both may include a transparent electrode if needed. Additionally, it should be noted that in some embodiments, layers formed between a transparent electrode and an organic material layer of the OLED may have a transmissivity greater than about 0.5 to the electromagnetic spectrum of the light source used to irradiate the OLED.

During the manufacturing of the OLED illustrated in FIG. 3, the irradiation process can be performed before the first operation, or after the formation of the second electrode layer which may function as a cathode. The method of manufacturing the OLED according to the present invention can be used to manufacture any type of organic light-emitting display device including an organic electrolumienscent device.

It will be apparent to those skilled in the art that various modifications and variations can be made in the present invention without departing from the spirit or scope of the invention. Thus, it is intended that the present invention cover the modifications and variations of the invention provided they come within the scope of the appended claims and their equivalent.

What is claimed is:

1. A method of manufacturing an organic light-emitting diode (OLED) having an organic material having an absorption spectrum, where the organic material can generate photoluminescence by absorbing radiated electromagnetic energy of a wavelength of the absorption spectrum, comprising irradiating the OLED with electromagnetic radiation, wherein a radiation spectrum of the electromagnetic radiation at least partially corresponds to the absorption spectrum of the organic material, and wherein an energy density of the electromagnetic radiation is equal to or greater than about 500 Ws/cm$^2$.

2. The method of claim 1, wherein irradiating the OLED is performed before the OLED is first used.

3. The method of claim 2, wherein irradiating the OLED is performed after a cathode of the OLED is deposited.

4. The method of claim 1, wherein irradiating the OLED is performed after the OLED first operates.

5. The method of claim 4, wherein irradiating the OLED is performed during the burn-in process.

6. The method of claim 1, wherein the OLED comprises a transparent electrode, and the electromagnetic radiation is irradiated through a surface of the transparent electrode.

7. The method of claim 1, wherein the OLED is irradiated for between about 1 minute to about 10 hours.

8. The method of claim 7, wherein the OLED is irradiated for between about 3 hours to about 6 hours.

9. The method of claim 1, wherein a light source generates the electromagnetic radiation and the OLED is spaced from the light source by about 5 cm to about 150 cm.

10. The method of claim 1, wherein a substrate of the OLED has a transmissivity greater than about 0.5 in higher-frequency and lower-frequency portions of the radiation spectrum, and the radiation spectrum at least partially corresponds to the absorption spectrum of the organic material layer of the OLED.

11. The method of the claim 1, wherein layers formed between the transparent electrode and organic material layer of the OLED comprise a transmissivity greater than about 0.5 to the radiation spectrum.

12. The method of the claim 1, wherein a light source generates the electromagnetic radiation and the light source comprises either a sun simulator or a UV light source.

13. An OLED, comprising:
a first electrode;
an organic material layer having an absorption spectrum; and
a second electrode,
wherein the OLED is subjected to electromagnetic radiation having a radiation spectrum that at least partially corresponds the absorption spectrum of the organic material layer, and
wherein an energy density of the electromagnetic radiation is equal to or greater than about 500 Ws/cm$^2$.

14. The OLED of claim 13, wherein the electromagnetic radiation is irradiated before the OLED is first used.

15. The OLED of claim 14, wherein the electromagnetic radiation is irradiated after a cathode of the OLED is deposited.

16. The OLED of claim 13, wherein the electromagnetic radiation is irradiated after the OLED first operates.

17. The OLED of claim 16, wherein the electromagnetic radiation is irradiated during the burn-in process.

* * * * *